(12) United States Patent
Chou et al.

(10) Patent No.: US 7,619,429 B2
(45) Date of Patent: Nov. 17, 2009

(54) INTEGRATED PROBE MODULE FOR LCD PANEL LIGHT INSPECTION

(75) Inventors: Min-Chieh Chou, Hsin-Chu (TW); Jiu-Shu Tasi, Hsin-Chu (TW); Horng-Jee Wang, Taipei (TW); Ya-Ju Huang, Chung-Li (TW); Kun-Chih Pan, Tai Chung (TW); Chih-Wei Chen, Hsin Chu (TW); Jyh-Chun Chang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/689,262

(22) Filed: Oct. 20, 2003

(65) Prior Publication Data

US 2005/0083074 A1 Apr. 21, 2005

(51) Int. Cl.
*G01R 31/02* (2006.01)
(52) U.S. Cl. ..................................................... 324/762
(58) Field of Classification Search ................. 324/765, 324/158.1, 754, 72.5, 760, 761, 762, 758; 439/482, 700
See application file for complete search history.

(56) References Cited

U.S. PATENT DOCUMENTS

| | | | | |
|---|---|---|---|---|
| 4,975,638 A * | 12/1990 | Evans et al. | ................. | 324/754 |
| 5,720,098 A * | 2/1998 | Kister | ........................... | 29/825 |
| 5,798,655 A * | 8/1998 | Kazama et al. | ............. | 324/761 |
| 5,959,957 A * | 9/1999 | Ikeda et al. | ................. | 369/127 |
| 6,023,171 A * | 2/2000 | Boyette et al. | ............... | 324/754 |
| 6,059,982 A * | 5/2000 | Palagonia et al. | ............. | 216/11 |
| 6,072,190 A * | 6/2000 | Watanabe et al. | ............. | 257/48 |
| 6,174,744 B1 * | 1/2001 | Watanabe et al. | ............. | 438/14 |
| 6,362,642 B1 * | 3/2002 | Farnworth | ................... | 324/765 |
| 6,426,638 B1 * | 7/2002 | Di Stefano | ................... | 324/754 |
| 6,616,966 B2 * | 9/2003 | Mathieu et al. | ............... | 29/842 |
| 6,710,608 B2 * | 3/2004 | Yoshida et al. | ............... | 324/754 |
| 6,771,084 B2 * | 8/2004 | Di Stefano | ................... | 324/754 |
| 2005/0012513 A1 * | 1/2005 | Cheng et al. | ................. | 324/754 |
| 2005/0035775 A1 * | 2/2005 | Zhou et al. | ................... | 324/754 |

FOREIGN PATENT DOCUMENTS

| | | |
|---|---|---|
| CN | 1194692 A | 9/1998 |
| CN | 1368640 A | 9/2002 |
| CN | 1411329 A | 4/2003 |
| JP | 2002-296296 | 10/2002 |
| TW | 510971 | 11/2002 |
| TW | 510972 | 11/2002 |
| TW | 531642 | 5/2003 |
| TW | 539128 | 6/2003 |
| TW | 545582 | 8/2003 |
| TW | 547798 | 8/2003 |

* cited by examiner

*Primary Examiner*—Ha Tran T Nguyen
*Assistant Examiner*—Tung X Nguyen
(74) *Attorney, Agent, or Firm*—Quintero Law Office

(57) ABSTRACT

A probe module which is particularly suitable for testing an LCD panel. The probe module includes a probe base, a plurality of probe pins provided on the probe base, and a high-density circuit interconnection which includes a flexible circuit board that connects the probe pins to a testing apparatus. The tip of each probe pin may have a pointed or tapered configuration, or alternatively, a hemi-spherical configuration.

14 Claims, 4 Drawing Sheets

INTEGRATED PROBE MODULE FOR LCD PANEL LIGHT INSPECTION

FIELD OF THE INVENTION

The present invention relates to LCD (Liquid Crystal Display) panels. More particularly, the present invention relates to an integrated probe module for testing LCD panels, which integrated probe module has a single body formed by Micro Electrical Mechanical Systems (MEMS) technology.

BACKGROUND OF THE INVENTION

Conventionally, contact probe modules have been widely used for testing electroconductive patterns of printing circuit boards and various electronic devices, and there have been attempts to modify them into more suitable forms for testing LCD panels. In testing of an LCD panel, it is desirable to test the panel under conditions which closely approximate the actual conditions of the final product. Therefore, it is desirable to test the LCD panel by using a TAB (an LSI chip used for driving an LCD panel) identical to that used in the final product. Because a large number of wires must be connected between the LCD panel and the TAB, the TAB should be incorporated into the contact probe module itself.

With liquid crystal front panel development, size and analysis increases require that the probe module applied to the LCD panel require higher pin count and finer pitch. Currently, LCD analysis technology utilizes two types of probe modules: a needle type and a membrane type. The needle-type probe module, an example of which is generally indicated by reference numeral 10 in FIG. 1, includes multiple probe needles 14 extending from a probe base 12. The probe needles 14 contact respective terminals 20 provided on a panel board 18 of an LCD panel 16.

Use of the conventional needle-type probe module 10 to test the LCD panel 16 requires that the multiple probe needles 14 be individually assembled on the probe base 12, as well as individually adjusted to the probe surface level. This adjustment is time-consuming and laborious. Furthermore, the pitch of the needles is limited to 50 μm. This limits the number of needles which can be provided on the probe base. Because the probes have a low stress tolerance, a common surface level is required for probing. Moreover, when one or more of the pins is damaged, the whole probe needle assembly must be returned to the assembly plant for repair.

The membrane-type of probe module utilizes an electroplating method to fabricate metal bumps or contact points on a membrane. While the membrane-type probe module avoids the complicated assembly procedure of the needle-type probe module, the electroplating method introduces unevenness into the membrane, causing the metal bumps on the membrane to vary in thickness. This adversely affects the surface level performance. Moreover, the height of the bump is typically limited by the fabrication technology to less than about 20 μm. Consequently, the probing ability of the membrane-type probe tip is easily adversely affected by micro-particles in the probing environment.

Another drawback which is associated with the membrane-type probe module is that the membrane on which the bumps are fabricated repeatedly flexes and relaxes throughout repeated use of the unit. Consequently, the membrane has a tendency to fatigue and break or peel from the underlying metal substrate of the probe module. Considerable difficulty has been encountered in developing a membrane material of sufficient elasticity to withstand the flexing and bending pressures of probe testing.

To overcome the drawbacks of the conventional needle-type probe module and membrane-type probe module, the present invention utilizes MEMS (Micro Electrical Mechanical Systems) technology to fabricate probing modules for the testing of LCD panels and related devices. The present invention replaces the complicated traditional manual packaging procedure and provides an ultra-fine pitch and precision locator high hardness probe structure, in addition to increasing the tolerance of the probe tip to environmental particle contamination. The present invention increases the ease of maintenance or replacement of probe tips, thus decreasing cost and increasing the production rate.

An object of the present invention is to provide a new and improved probe module which is suitable for probing LCD panels.

Another object of the present invention is to provide a new and improved probe module which utilizes MEMS technology to fabricate a probe module.

Still another object of the present invention is to provide a new and improved probe module which is characterized by ultra-fine probe pin pitch adjustment and location.

Yet another object of the present invention is to provide new and improved probe pins manufactured using MEMS technology.

A still further object of the present invention is to provide a probe module which has a high tolerance for environmental particle contamination.

Another object of the present invention is to provide a probe module characterized by low cost and high efficiency.

A still further object of the present invention is to provide a probe module characterized by a high-density and high-number pin count and high electrical performance.

SUMMARY OF THE INVENTION

In accordance with these and other objects and advantages, the present invention relates to a new and improved probe module which is particularly suitable for testing an LCD panel. The probe module includes a probe base, a plurality of probe pins provided on the probe base, and a high-density circuit interconnection which includes a flexible circuit board that connects the probe pins to a testing apparatus. The tip of each probe pin may have a pointed or tapered configuration, or alternatively, a hemi-spherical configuration.

Each of the probe pins is fabricated in a typically silicon substrate using lithography and etching techniques. A high-density bonding method is used to bond the probe pins to the probe base. This bonding method provides excellent precision and imparts a common surface level to the probe pin tips. The probe base is fitted with an adjustable compression arm for adjusting the pressure of the probe pin tips against the bonding points on the LCD panel.

According to one method of fabricating the probe module, each of the probe tips is fabricated using photolithography techniques to precisely define the location and geometry of the probe pin in the substrate. The substrate is then etched to define a hollow probe pin cavity in the substrate which corresponds to the configuration of the probe pin. The probe pin cavity is then filled with a high-conductivity metal, such as copper, nickel and nickel alloys to form the probe pin in the probe pin cavity.

The high-density conductive circuit for each probe pin is fabricated on the glass probe base, using photolithography techniques. With the probe pins remaining in the substrate, each probe pin is mounted to the glass probe base, in electrical contact with its conductive circuit. An anisotropic conductive film (ACF) is interposed between the circuit and the probe pin to provide independent conductivity between each probe pin and the corresponding conductive circuit. This prevents electrical shorting between adjacent probe pins on the probe base.

After the probe pins are bonded to the glass probe base, plasma etching technology is used to etch the silicon substrate away from the probe pins. This completely exposes the probe pins and probe pin tips to facilitate electrical contact between the probe pin tips and the points on the LCD panel to be tested.

ACF is then used to bond one end of a flexible circuit board to the respective conductive circuits on the probe base. This facilitates independent electrical conductance between each of the conductive circuits and the circuit board. The opposite end of the flexible circuit board is electrically connected to the inspection apparatus.

BRIEF DESCRIPTION OF THE DRAWINGS

The invention will now be described, by way of example, with reference to the accompanying drawings, in which:

FIGS. 3A-3G are cross-sectional views of a silicon substrate, illustrating sequential steps in the fabrication of a probe pin in the substrate according to an alternative embodiment of the invention;

FIGS. 4A-4C are side views illustrating sequential steps in bonding the substrate to a probe base, etching the substrate from the probe pins, and bonding the flexible circuit board to the probe base, respectively, according to one embodiment of the present invention;

DETAILED DESCRIPTION OF THE INVENTION

The present invention generally relates to a new and improved probe module for the testing of LCD panels. The probe module is characterized by superior electrical performance and includes multiple probe pins having a pitch which exceeds conventional process limits. The probe pins are part of a fine-pitch integrated micro-probe structure which is constructed in a single body by Micro Electro Mechanical Systems (MEMS) Technology.

Figure 8:
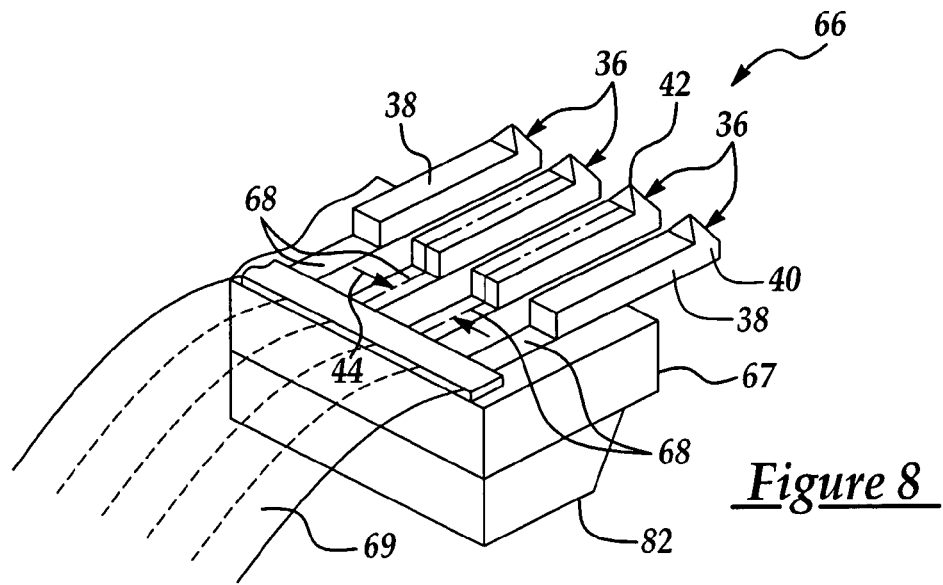
FIG. 8 is a bottom perspective view of a probe module according to the present invention.
Figure 9:
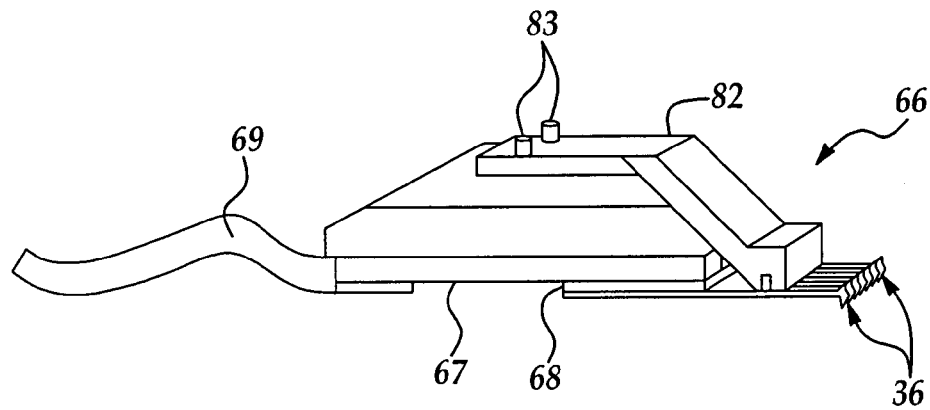
FIG. 9 is a top perspective view of a probe module according to the present invention.

Referring initially to FIGS. 8 and 9, an illustrative embodiment of the probe module of the present invention is generally indicated by reference numeral 66. The probe module 66 includes a typically glass probe base 67. Multiple metal traces of conductive circuits 68 are provided on the bottom surface of the probe base 67. Probe pins 36, each of which is a metal of high electrical conductivity, such as copper, are bonded to the respective circuit traces 68. A flexible circuit board 69 electrically connects the probe pins 36 to a testing apparatus (not shown) for the testing of an LCD panel using the probe module 66.

As shown in FIG. 9, a compression arm 82, which is typically fitted with a pair of adjustment screws 83, is provided on the probe base 67 and engages the probe pins 36. The adjustment screws 83 can be manipulated to adjust the compression arm 82 against the probe pins 36 and adjust the contact angle of the probe pins 36 with respect to the test points (not shown) on the LCD panel (not shown) during testing of the LCD panel.

Figure 1:
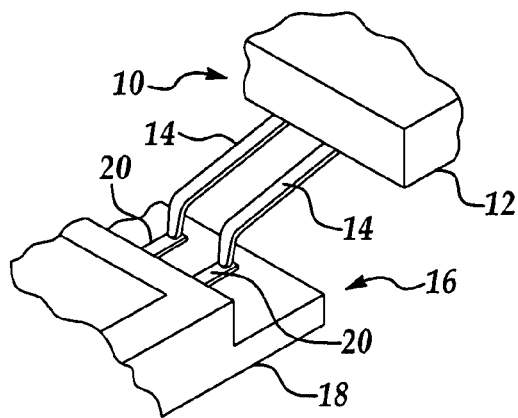
FIG. 1 is perspective view of a conventional, needle-type probe module (in section), being used to test an LCD panel (in section)
Figure 2A:
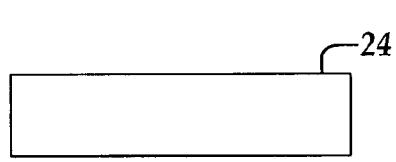
FIGS. 2A-2D are cross-sectional views of a silicon substrate, illustrating sequential steps in the fabrication of a probe pin having a pointed or tapered probe pin tip in the substrate according to one embodiment of the present invention.
Figure 2B:
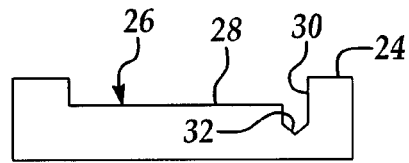

Referring next to FIGS. 2A-2D, the probe pins 36 are initially sequentially fabricated in a substrate 24 (FIG. 2A), which is typically silicon. The substrate 24 is initially cleaned, dried and pre-processed, as needed, for subsequent fabrication of the probe pins 36. Multiple probe pin cavities 26 (one of which is shown), each of which includes an elongated pin body cavity 28, a pin head cavity 30 and a pin tip cavity 32, as shown in FIG. 2B, are then etched in the substrate 24.

Conventional lithography etching techniques are used to precisely define the geometry and location of each of the probe pin cavities 26 in the substrate 24. Reactive ion etching (RIE) is used to perform anisotropic etching to a predefined depth of the probe pin cavity 26 in the substrate 24. Based on the processing characteristics, high aspect ratios of depth and width can be achieved for each of the probe pin cavities 26.

After the basic geometry for each probe pin 36 has been pre-etched in the substrate 24, the lithography process is repeated to define the structure of each probe pin 36 in the substrate 24. The probe pin cavities 26 are etched in the substrate 24 using reactive ion etching, after which the etched substrate 24 is dipped in a Silica etching solution (not shown). The difference in the etching rates of the Silica etching solution is used to form the pointed or tapered pin tip cavity 32 in the substrate 24. The pin tip cavity 32 of each probe pin cavity 26 typically has an inverted pyramid or tetrahedron-shaped configuration.

Figure 2C:
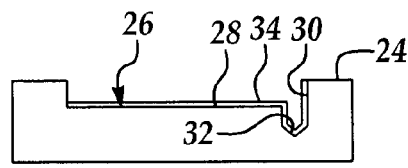

As shown in FIG. 2C, conventional electroplating techniques are used to deposit a metal seed layer 34 in the probe pin cavity 26. The seed layer 34 lines the pin body cavity 28, the pin head cavity 30 and the pin tip cavity 32 in the probe pin cavity 26. Preferably, the seed layer 34 is nickel. Other suitable materials for the seed layer 34 include copper and gold, in non-exclusive particular.

Figure 2D:
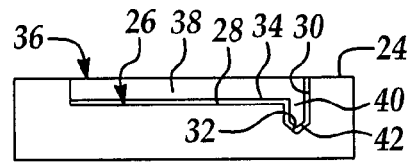

As shown in FIG. 2D, each probe pin 36 is formed in the corresponding probe pin cavity 26 typically using conventional micro electro-forming technology to fill in the probe pin cavity 26 with a metal of high conductivity. Each probe pin 36 includes a probe pin body 38 which fills the pin body cavity 28 of the probe pin cavity 26; a probe pin head 40 which extends downwardly from one end of the probe pin body 38 and fills the pin head cavity 30; and a probe pin tip 42 which terminates the bottom end of the probe pin head 40 and fills the pin tip cavity 32.

Figure 2E:
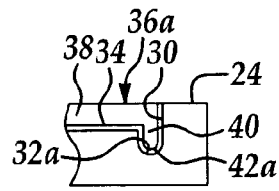
FIG. 2E is a cross-sectional view of a silicon substrate, illustrating fabrication of a probe pin having a semi-spherical probe pin tip in an alternative embodiment of the invention.

As further shown in FIG. 2D, in one embodiment the probe pin tip 42 of each probe pin 36 has a tapered or pointed, inverted tetrahedral or pyramid shape which conforms to the complementary shape of the pin tip cavity 32. In an alternative embodiment, shown in FIG. 2E, the probe pin tip 42a of each probe pin 36a has a rounded or semi-spherical configuration which conforms to the corresponding complementary shape of the pin tip cavity 32a.

Figure 3G:
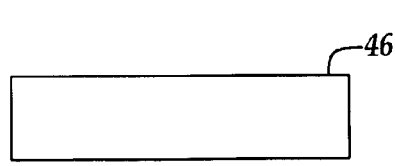
Figure 3G:
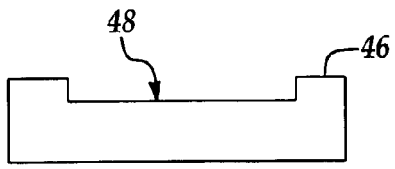
Figure 3G:
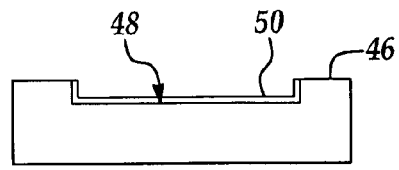
Figure 3G:
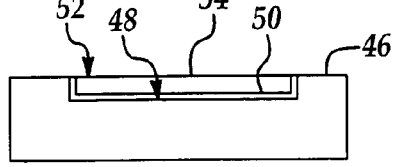
Figure 3G:
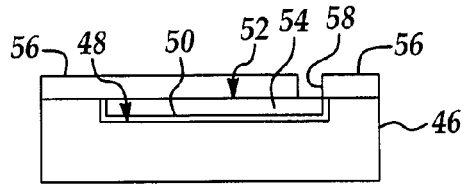
Figure 3G:
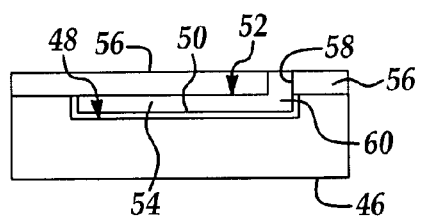
Figure 3G:
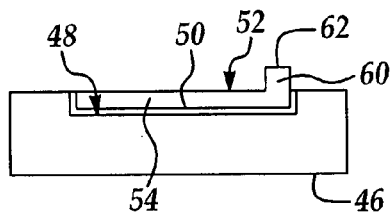

Referring next to FIGS. 3A-3G, in an alternative embodiment each of the probe pins 52 includes a probe pin head 60 having a flat or planar probe pin tip 62, as shown in FIG. 3G. The probe pins 52 are sequentially fabricated in a typically silicon substrate 46, shown in FIG. 3A. As shown in FIG. 3B, for each of the probe pins 52 fabricated in the substrate 46, an elongated probe pin cavity 48 is initially etched in the substrate 46 using conventional photolithography and reactive ion etching techniques. A metal seed layer 50 is then used to line the probe pin cavity 48, as shown in FIG. 3C. Using micro electro-forming technology, the probe pin body 54 of the probe pin 52 is next formed in the probe pin cavity 48, as shown in FIG. 3D, by depositing a high-conductivity metal such as copper in the probe pin cavity 48.

Next, as shown in FIG. 3E, a layer of photoresist 56 is deposited on the substrate 46 and probe tip body 54. A head cavity 58 is patterned in the photoresist 56 above each probe tip body 54. The head cavity 58 is filled with metal to form the probe pin head 60 of each probe pin 52, such that the probe pin head 60 is continuous with the probe tip body 54. Finally, as shown in FIG. 3G, the photoresist 56 is stripped from the substrate 46 and probe pin 52.

Figure 4C:
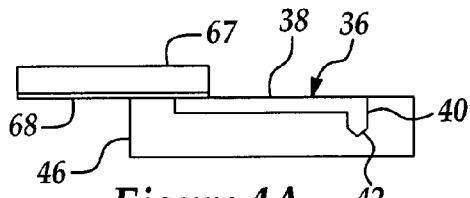
Figure 4C:
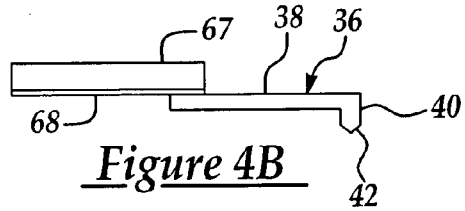
Figure 4C:
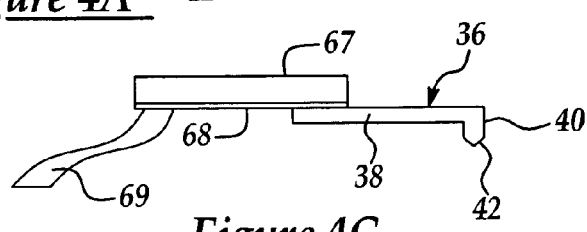

Referring next to FIGS. 4A-4C, a typical high-density circuit interconnection process for each probe pin 36 is as follows. Using lithography techniques, a conductive probe circuit 68 is fabricated on the typically glass probe base 67 for each of the probe pins 36 fabricated in the substrate 46. The metal traces for the conductive circuits 68 may be gold, copper or chromium, for example.

Next, as shown in FIG. 4A, the probe pin body 38 of each probe pin 36 is bonded to the corresponding conductive circuit 68. This is typically carried out using anisotropic conductive film (AFC), to provide independent electrical conductance between each conductive circuit 68 and the corresponding probe pin 36. This prevents electrical shorting between adjacent probe pins 36 on the probe module 66 in use of the finished probe module 66 to test LCD panels (not shown).

As shown in FIG. 4B, the substrate 46 is removed from the probe pins 36. This is carried out typically using conventional plasma etching techniques. The plasma etching process typically uses chlorine gas which is subjected to a low-voltage current to form a low-energy etchant plasma. The plasma etches the substrate 46 away from the probe pins 36 to completely expose each probe pin 36.

As shown in FIG. 4C, one end of an elongated, flexible circuit board 69 is bonded to the conductive circuit 68 of each probe pin 36 to provide independent electrical conductance between each probe pin 36 and the flexible circuit board 69. Protection glue (not shown) is typically used to isolate the flexible circuit board 69 from environmental variations that could affect conductivity. The opposite end of the flexible circuit board 69 is connected to the inspection apparatus (not shown) for testing of LCD panels.

Figure 5A:
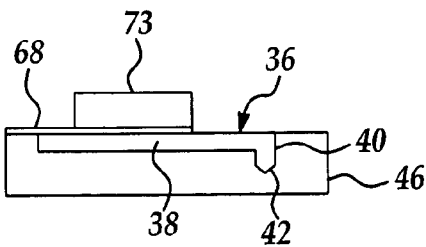
FIGS. 5A-5C are side views illustrating the substrate bonding, substrate etching and flexible circuit board bonding steps according to another embodiment of the present invention.
Figure 5B:
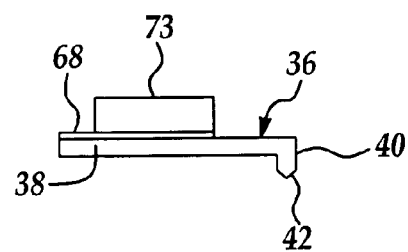
Figure 5C:
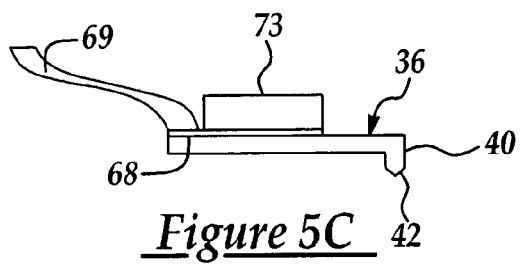

Another high-density circuit interconnection process is shown in FIGS. 5A-5C. In that process, each probe pin 36 is bonded to the corresponding conductive circuit 68, as shown in FIG. 5A, typically using a UV-activated or thermally-activated bonding glue. The silicon substrate 46 is then etched away from the probe pins 36, as shown in FIG. 5B. Next, anisotropic conductive film (ACF) is used to bond one end of the flexible circuit board 69 to the conductive circuits 68.

Figure 6A:
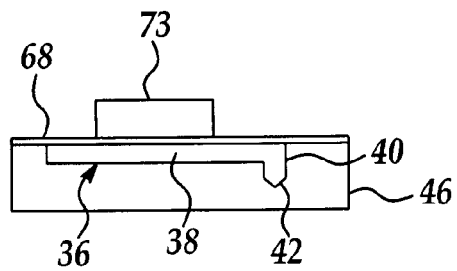
FIGS. 6A-6C are side views illustrating the substrate bonding, substrate etching and flexible circuit board etching steps according to still another embodiment of the present invention.
Figure 6B:
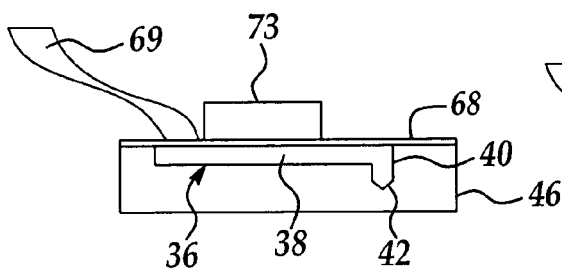
Figure 6C:
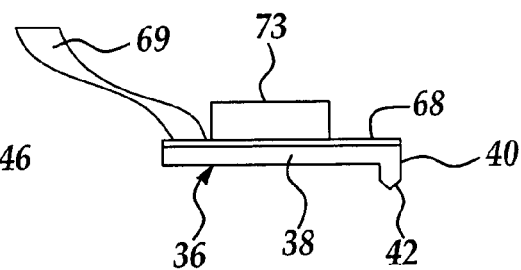

In still another high-density circuit interconnection process, shown in FIGS. 6A-6C, the probe pins 36 are first bonded to the respective conductive circuits 68, as shown in FIG. 6A. Next, the anisotropic conductive film (ACF) is used to bond the flexible circuit board 69 to the conductive circuits 68, as shown in FIG. 6B. Finally, the substrate 46 is etched from the probe pins 36, as shown in FIG. 6C.

Figure 7A:
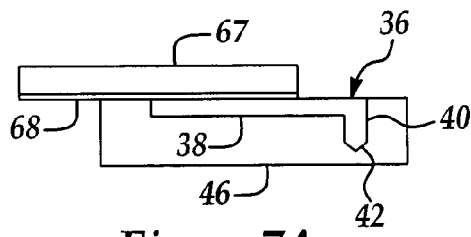
FIGS. 7A-7C are side views illustrating the substrate bonding, substrate etching and flexible circuit board etching steps according to yet another embodiment of the invention.
Figure 7B:
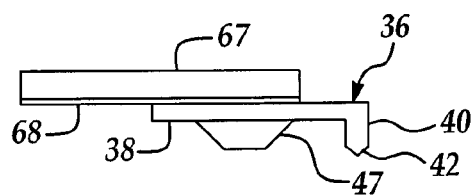
Figure 7C:
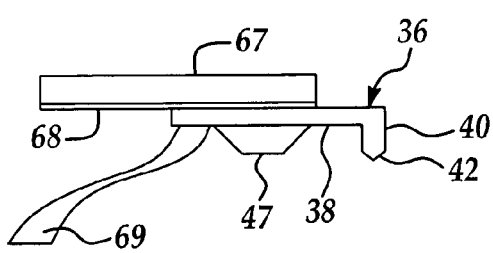

Referring to FIGS. 7A-7C, in yet another high-density circuit interconnection process, diffusion bonding can be used to bond the silicon substrate 46 to the probe base 67, as shown in FIG. 7A. Wet or dry etching is then used to etch most of the silicon substrate 46 to a desired thickness to define the probe pin 36. A portion 47 of the substrate 46 remains in place after the etching process, as shown in FIG. 7B, to fix each probe pin 36 in a precise location. Finally, as shown in FIG. 7C, the flexible circuit board 69 is bonded directly to the probe pins 36.

Referring again to FIGS. 8 and 9, the compression arm 82, which is a flexible metal or plastic, is mounted on the probe base 67 to complete fabrication of the probe module 66. The compression arm 82 contacts the upper surfaces of the probe pins 36 to apply pressure against the probe pins 36 and impart over-drive to the probe pins 36. The micro-adjustable adjustment screws 83 facilitate fine adjustment in the contact angle of the probe pins 36. Because they are part of a common structure, the probe pin tips 42 of the probe pins 36 are capable of being disposed in a common plane during testing of LCD panels. As shown in FIG. 8, the pitch 44 of the probe pins 36 is typically about 30 µm.

Figure 10:
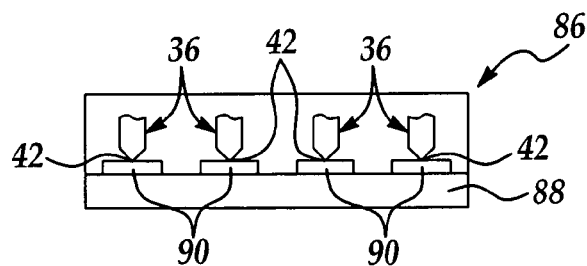
FIG. 10 is a front view, partially in section, of an LCD panel, illustrating a typical manner of use of the probe module in testing of the LCD panel.

Referring next to FIG. 10, in application the probe module 66 (FIG. 9) is used to test an LCD panel 86. The LCD panel 86 typically includes a panel board 88 on which is provided multiple terminals 90. The probe pin tips 42 of the respective probe pins 36 on the probe module 66 are brought into contact with the respective terminals 90. The flexible circuit board 69 (FIG. 9) is connected to an inspection apparatus (not shown), typically in conventional fashion. Accordingly, the terminals 90 are disposed in electrical contact with the inspection apparatus through the probe pins 36, conductive circuits 68 and flexible circuit board 69, respectively. The probe module 66 transmits electrical information from the terminals 90 to the inspection apparatus to test the various electrical characteristics of the LCD panel 86.

While the preferred embodiments of the invention have been described above, it will be recognized and understood that various modifications can be made in the invention and the appended claims are intended to cover all such modifications which may fall within the spirit and scope of the invention.

What is claimed is:

1. A probe module for testing an LCD panel having a plurality of test points comprising:
   a probe base having a plurality of conductive metal traces;
   a plurality of completely exposed probe pins attached to the probe base, each of the probe pins comprising an elongate body, wherein at least part of the elongated body is bonded to at least one of the plurality of conductive metal traces of the probe base;
   a flexible circuit interconnect device for connecting the plurality of probe pins to an inspection apparatus;
   a flexible compression arm attached to a probe base and configured to engage the plurality of probe pins; and
   at least one adjustment element provided on the probe base configured to variably adjust a pressure of the flexible compression arm against the plurality of probe pins during testing of the LCD panel such that different pressures of the flexible compression arm against the plurality of probe pins produce different contact angles of the probe pins with respect to the test points.

2. The probe module of claim 1, wherein each of the plurality of probe pins further comprises a probe pin head extending from the probe pin body and a generally tapered probe pin tip provided on the probe pin head.

3. The probe module of claim 1, wherein the circuit interconnect device comprises a plurality of conductive probe circuits provided on the probe base in electrical contact with the plurality of probe pins, respectively, and a flexible circuit board provided in electrical contact with the plurality of conductive probe circuits.

4. The probe module of claim 1, wherein each of the plurality of probe pins further comprises a probe pin head extending from the probe pin body and a generally semi-spherical probe pin tip provided on the probe pin head.

5. The probe module of claim 1 wherein the plurality of probe pins have a generally tetrahedral probe pin tip.

6. The probe module of claim 1, wherein the flexible circuit interconnect device couples the probe pins to a testing unit via the conductive metal traces.

7. The probe module of claim 1, wherein the probe pins include a probe head having at least one of a tapered, semi-spherical, inverted-pyramid or a tetrahedral shape.

8. The probe module of claim 1, wherein the probe pins include an elongated arm body such that at least a part of the elongated arm body is attached with the probe base.

9. The probe module of claim 1, wherein the adjustment element is a screw.

10. The probe module of claim 1, wherein the flexible compression arm comprises plastic.

11. The probe module of claim 1, wherein the flexible compression arm comprises metal.

12. The probe module of claim 1, wherein a pitch between adjacent ones of the plurality of probe pins is about 30 um.

13. The probe module of claim 1, wherein the adjustment element is a micro-adjustable adjustment screw.

14. A probe module for testing an LCD panel having a plurality of test points comprising:
   a probe base having a plurality of conductive metal traces;
   a plurality of completely exposed probe pins attached to the probe base, each of the probe pins comprising an elongate body, wherein at least part of the elongated body is bonded to at least one of the plurality of conductive metal traces of the probe base;
   a flexible circuit interconnect device for connecting the plurality of probe pins to an inspection apparatus;
   a flexible compression arm attached to a probe base and configured to engage the plurality of probe pins; and
   at least one adjustment element provided on the probe base for adjustably increasing and decreasing a pressure of the flexible compression arm on the plurality of probe pins during testing of the LCD panel so as to adjust a pressure of the probe pins on the test points.

* * * * *